(12) United States Patent
Jiang et al.

(10) Patent No.: US 12,095,455 B2
(45) Date of Patent: Sep. 17, 2024

(54) LEVEL SHIFT CIRCUIT FOR PROTECTING TRANSISTORS AND DISPLAY DEVICE THEREOF

(71) Applicant: FocalTech Electronics (Shenzhen) Co., Ltd., Shenzhen (CN)

(72) Inventors: Xin-Xi Jiang, Guangdong (CN); Tian-Qi Sun, Guangdong (CN); Zhen-Juan Cheng, Guangdong (CN); Jing-Kai Zhang, Guangdong (CN)

(73) Assignee: FocalTech Electronics (Shenzhen) Co., Ltd., Shenzhen (CN)

( * ) Notice: Subject to any disclaimer, the term of this patent is extended or adjusted under 35 U.S.C. 154(b) by 0 days.

(21) Appl. No.: 18/024,342

(22) PCT Filed: Mar. 12, 2021

(86) PCT No.: PCT/CN2021/080579
§ 371 (c)(1),
(2) Date: Mar. 2, 2023

(87) PCT Pub. No.: WO2022/048128
PCT Pub. Date: Mar. 10, 2022

(65) Prior Publication Data
US 2023/0318602 A1    Oct. 5, 2023

(30) Foreign Application Priority Data
Sep. 2, 2020  (CN) .......................... 202010911667.2

(51) Int. Cl.
*H03K 19/003* (2006.01)
*G09G 3/20* (2006.01)
*H03K 19/0185* (2006.01)

(52) U.S. Cl.
CPC ......... *H03K 19/00315* (2013.01); *G09G 3/20* (2013.01); *H03K 19/018521* (2013.01);
(Continued)

(58) Field of Classification Search
CPC ............ G09G 3/20; G09G 2300/0871; G09G 2310/0289; H03K 19/00315; H03K 19/018521; H03K 19/003; H03K 19/0175
See application file for complete search history.

(56) References Cited

U.S. PATENT DOCUMENTS 6,157,361 A  *  12/2000  Kubota ................ G09G 3/3674
327/333
11,409,314 B2    8/2022  Liu et al.
(Continued)

FOREIGN PATENT DOCUMENTS

CN    108540124 A    9/2018
CN    109327218 A    2/2019
(Continued)

*Primary Examiner* — Hong Zhou
(74) *Attorney, Agent, or Firm* — ScienBiziP, P.C.

(57) ABSTRACT

A level shift circuit converts input signals in a first voltage domain into output signals in a second voltage domain. The level shift circuit includes a first voltage domain circuit, a middle voltage domain circuit, and a second voltage domain circuit. The middle voltage domain circuit convert the signals in the first voltage domain received by the first voltage domain circuit into signals in a middle voltage domain. The second voltage domain circuit converts the signals in the middle voltage domain into signals in the second voltage domain and outputs the converted signals. The signals in the middle voltage domain are partly different from the signals in the first voltage domain and the second voltage domain. Each signal in the first voltage domain is different from the signals in the second voltage domain. A display apparatus is also disclosed.

20 Claims, 5 Drawing Sheets

(52) U.S. Cl.
CPC ........... *G09G 2300/0871* (2013.01); *G09G 2310/0289* (2013.01)

(56) References Cited

U.S. PATENT DOCUMENTS

| | | | |
|---|---|---|---|
| 2005/0012536 A1* | 1/2005 | Chiu | H03K 19/018521 327/333 |
| 2005/0286187 A1 | 12/2005 | Liu et al. | |
| 2013/0120352 A1* | 5/2013 | Peng | G09G 5/00 345/212 |
| 2016/0012790 A1* | 1/2016 | Zheng | G09G 3/3688 345/204 |
| 2016/0126956 A1 | 5/2016 | Ryu et al. | |
| 2017/0154568 A1* | 6/2017 | Tsuchi | H03K 19/018521 |
| 2017/0272093 A1* | 9/2017 | Kim | G11C 19/00 |
| 2018/0262203 A1 | 9/2018 | Yang et al. | |

FOREIGN PATENT DOCUMENTS

| | | |
|---|---|---|
| CN | 110928356 A | 3/2020 |
| CN | 110995242 A | 4/2020 |
| TW | I346453 B | 8/2011 |

* cited by examiner

LEVEL SHIFT CIRCUIT FOR PROTECTING TRANSISTORS AND DISPLAY DEVICE THEREOF

The present application claims the priority of the Chinese invention patent application with the invention name "level shifter circuit" submitted to the China Patent Office on Sep. 2, 2020, application No. 202010911667.2, and the whole content of which is hereby incorporated by reference.

TECHNICAL FIELD

The subject matter herein generally relates to a level shift circuit.

BACKGROUND

Each display device includes a display panel and a display driving circuit for driving the display panel to display images. The display driving circuit disposed in a non-display region includes a level shift circuit. The level shift circuit can convert signals in a low voltage domain into signals in a high voltage domain, or convert signals in the high voltage domain into the signals in the low voltage domain, thus the signals are transmitted between different voltage domains. The level shift circuit includes an input circuit, an output circuit, and a control circuit electrically connected between the input circuit and the output circuit. The input circuit with at least a pair of transistors includes a positive input terminal and a negative input terminal. The output circuit with at least a pair of transistors includes a positive output terminal and a negative output terminal. In the current display driving circuit, the level shift circuit is mainly used for two different voltage domains, a common ground terminal is provided to the different voltage domains. A withstand threshold voltage of each transistor in the level shift circuit is related to a difference between a high voltage and a corresponding ground voltage. The high voltage after being converted by the level shift circuit needs to be less than a breakdown voltage range (such as a gate oxide breakdown voltage, a drain electrode to a substrate breakdown voltage, a source electrode to drain electrode breakdown voltage, and so on). Once the voltage being larger than the breakdown voltage range, the transistors are broken down, a type of the transistor needs to be changed (such as replacing a transistor having a lower withstand threshold voltage with a transistor having a middle or high withstand threshold voltage), thus a manufacture of the display device is more complex, and a cost of the display device is increased.

Thus, there is room for improvement in the art.

SUMMARY OF THE DISCLOSURE

The present application provides a level shift circuit, which solves the technology problem of the transistor being broken down while a high level voltage or a voltage difference between a high level voltage and a ground voltage being larger than a withstand threshold voltage range of the transistor in the related art.

A level shift circuit for converting signals from a first voltage domain into signals in a second voltage domain; the level shift circuit comprising:

a first voltage domain circuit, configured to receive signals in the first voltage domain; the signal in the first voltage domain is switched between a first high level voltage and a first low level voltage;

a middle voltage domain circuit, configured to convert the signals in the first voltage domain into signals in a middle voltage domain; the signal in the middle voltage domain is switched between a second high level voltage and the first low level voltage; the first high level voltage is different from the second high level voltage; and a second voltage domain circuit, configured to convert the signals in the middle voltage domain into signals in the second voltage domain; the signal in the second voltage domain is switched between the second high level voltage and a second low level voltage; the first high level voltage and the second high level voltage are larger than the first low level voltage and the second low level voltage respectively; and the second low level voltage is difference from the first low level voltage.

Based on the structure of the level shift circuit above, the second voltage domain circuit converts the signals in the first voltage domain into the signals in the second voltage domain, and the low level voltage is switched. By the second voltage domain circuit, the voltage change of each transistor in the first level shift circuit is less than a corresponding withstand threshold voltage, and the transistors in the first level circuit is protected from being broken down while converting in different voltage domains.

LABELS OF DRAWINGS

| | |
|---|---|
| Display apparatus | 100 |
| Scan driving circuit | 110 |
| Data driving circuit | 120 |
| Time controller | 130 |
| Display region | 101 |
| Non-display region | 103 |
| Scan lines | $S_1$-$S_n$ |
| Data lines | $D_1$-$D_m$ |
| Pixel units | 20 |
| Level shift circuit | 200, 200A, 200B, 200C, 200D |
| First voltage domain circuit | 21 |
| Middle voltage domain circuit | 23 |
| Second voltage domain | 25 |
| Input unit | 231 |
| Control unit | 232 |
| Shielding unit | 234 |
| First input transistor | MN1, MP1 |
| Second input transistor | MN3, MP3 |
| First output transistor | MP1, MN1 |
| Second output transistor | MP3, MN3 |
| First control transistor | MP2, MN2 |
| Second control transistor | MP4, MN4 |
| First shielding transistor | MN2, MP2 |
| Second shielding transistor | MN4, MP4 |
| Third shielding transistor | MP7, MN7 |
| Fourth shielding transistor | MP8, MN8 |
| First output terminal | VOUTP |
| Second output terminal | VOUTN |

| First transistor | MN6, MP6 |
|---|---|
| Second transistor | MN8, MP8 |
| Third transistor | MN5, MP5 |
| Fourth transistor | MN7, MP7 |
| Fifth transistor | MP5, MN5 |
| Sixth transistor | MP6, MN6 |
| First node | N1 |
| Second node | N2 |
| Third node | N3 |
| Fourth node | N4 |
| First high level voltage | VDD1 |
| Second high level voltage | VDD2 |
| First low level voltage | GND1 |
| Second low level voltage | GND2 |
| Third invertor | INT3 |
| Fourth inventor | INT4 |
| Fifth inventor | INT5 |
| Sixth inventor | INT6 |

The following specific embodiments will further illustrate the present disclosure in conjunction with the above drawings.

DETAILED DESCRIPTION

The present disclosure is described with reference to accompanying drawings and the embodiments. It will be understood that the specific embodiments described herein are merely part of all embodiments, not all the embodiments. Based on the embodiments of the present disclosure, it is understandable to a person skilled in the art, any other embodiments obtained by persons skilled in the art without creative effort shall all fall into the scope of the present disclosure.

Terms "first", "second", and the like used in the specification, the claims, and the accompanying drawings of the present disclosure are used to distinguish different objects rather than describe a particular order. A term "comprise" and its variations are intended to cover a non-exclusive inclusion. For example, a process, method, system, product, or apparatus including a series of steps or units is not limited to the listed steps or units, and may optionally include other steps or units that are not listed, or other steps or units inherent to the process, method, product, or device.

Figure 1:
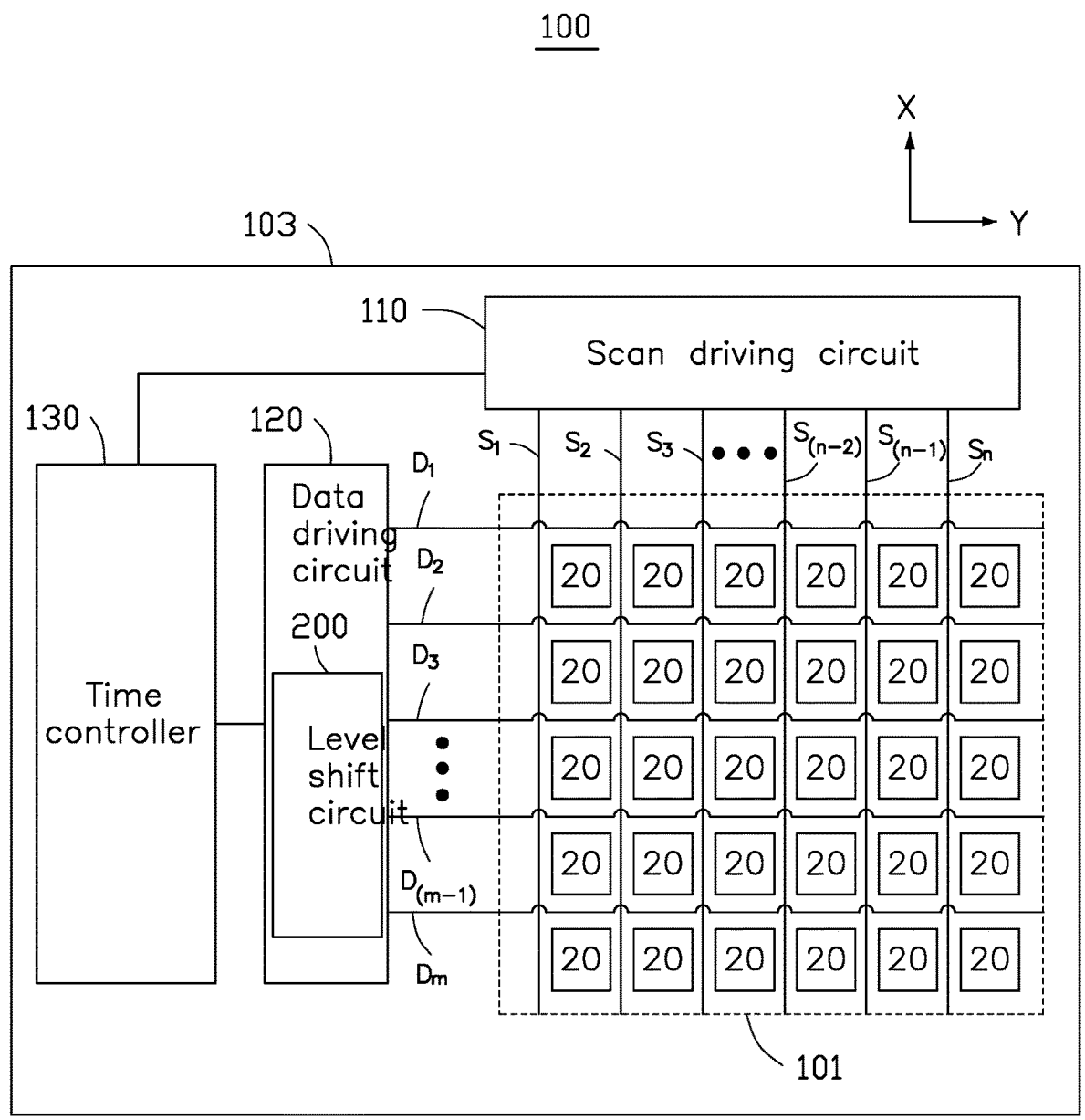
FIG. 1 is a diagram view of an embodiment of a display apparatus, the display apparatus includes a level shift circuit.

The level shift circuit and the display apparatus with the level shift circuit of the following specific embodiments of will further illustrate the present disclosure in conjunction with the above drawings. FIG. 1 shows a display apparatus 100. The display apparatus 100 defines a display region 101 and a non-display region 103 surrounding the display region 101. The display region 101 includes a number of scan lines $S_1$-$S_n$ and a number of data lines $D_1$-$D_m$. In one embodiment, n and m are positive integers. The scan lines $S_1$-$S_n$ are parallel with each other along a first direction X, and the data lines $D_1$-$D_m$ are parallel with each other along a second direction Y, direction Y being perpendicular to the first direction X. The scan lines $S_1$-$S_n$ are insulated from and are intersecting with the data lines $D_1$-$D_m$ to define a number of pixel units 20 in a matrix.

The display apparatus 100 includes a scan driving circuit 110, a data driving circuit 120, and a time controller 130. Each scan line $S_i$ is electrically connected between the scan driving circuit 110 and the pixel units 20 in one line. Each data line $D_m$ is electrically connected between the data driving circuit 120 and the pixel units 20 in one column. The time controller 130 is electrically connected to the scan driving circuit 110 and the data driving circuit 120. The time controller 130 generates various synchronization control signals. The various synchronization control signals may include periodic synchronization control signals and non-periodic synchronization control signals. The synchronization control signals may include synchronization signals, such as a vertical synchronization (Vsync) signal, a horizontal synchronization (Hsync) signal, and a data enable (DE) signal, and non-synchronization signals. In one embodiment, the time controller 130 generates clock signals to the scan driving circuit 110. The scan driving circuit 110 provides scan signals to the scan lines $S_1$-$S_n$ for scanning the pixel units 20. The data driving circuit 120 provides image signals to the data lines $D_1$-$D_m$ for displaying images. The image signals are digital signals, which is composed by low level voltage (such as logic "0") and high level voltage (such as logic "1"). In one embodiment, the scan driving circuit 110 is disposed on an upper side of the display region 101, and the data driving circuit 120 is disposed on a left side of the display region 101.

The data driving circuit 120 may include a level shift circuit 200. The level shift circuit 200 is used for converting input signals in a first voltage domain into output signals in a second voltage domain, and ensures a voltage different between the input signal and the corresponding output signal to be less than a withstand threshold voltage of transistors in the level shift circuit 200. A first high level voltage VDD1 in the first voltage domain is different from a second high level voltage VDD2 in the second voltage domain, and a first voltage difference is formed. A first low level voltage GND1 in the first voltage domain is different from a second low level voltage in the second voltage domain, and a second voltage difference is formed. The withstand threshold voltage is a maximum voltage difference between a source electrode and a drain electrode of a transistor. When the voltage difference between the source electrode and the drain electrode of the transistor is larger than the withstand threshold voltage, the transistor is broken down. In other embodiments, the level shift circuit 200 also may be used in the scan driving circuit 110.

First Embodiment

Figure 2:
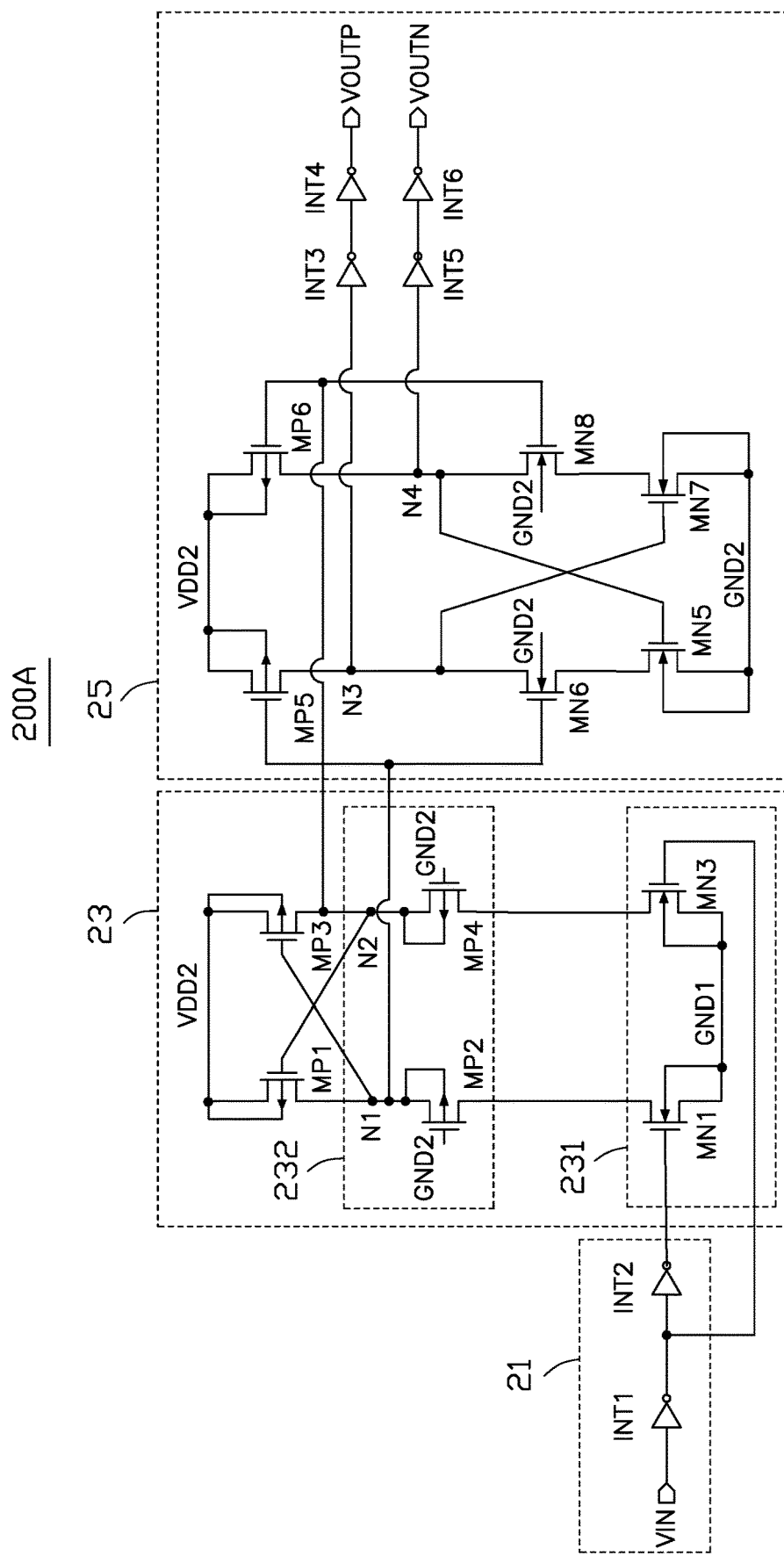
FIG. 2 is a circuit diagram illustrating a first embodiment of the level shift circuit of FIG. 1.

FIG. 2 shows a circuit diagram of a first embodiment of the first level shift circuit 200A. In the first embodiment, the first level shift circuit 200A converts the input signals in a low voltage domain into the output signals in a high voltage domain. The first high level voltage VDD1 is less than the second high level voltage VDD2, and the first low level voltage GND1 is less than the second low level voltage GND2. The first level shift circuit 200A may include a first voltage domain circuit 21, a middle voltage domain circuit 23, and a second voltage domain 25.

The first voltage domain circuit 21 receives the input signal in the first voltage domain and converts the input signals into a first output signal and a second output signal, which are provided to the middle voltage domain circuit 23, which are in the first voltage domain. Phases of the first output signal and the second output signal are opposite. In one embodiment, the input signals in the first voltage domain may be switched between the first high level voltage VDD1 and the first low level voltage GND1. The first voltage domain circuit 21 includes an input terminal VIN, a first invertor INT1, and a second invertor INT2. The input terminal VIN receives the input signals. The first invertor INT1 and the second invertor INT2 are electrically connected between the input terminal VIN and the middle voltage domain 23 in series. An input terminal of the first invertor INT1 is electrically connected with the input terminal VIN, and an output terminal of the first invertor INT1 is electrically connected with an input terminal of the second invertor INT2 and the middle voltage domain circuit 23. The input terminal of the second invertor INT2 is electrically connected with the output terminal of the first inventor INT1, and an output terminal of the second inventor INT2 is electrically connected with the middle voltage domain circuit 23.

The middle voltage domain circuit 23 is electrically connected between the first voltage domain circuit 21 and the second voltage domain circuit 25. The middle voltage domain circuit 23 converts the signals in the first voltage domain into signals in a middle voltage domain and outputs the signals in the middle voltage domain to the second voltage domain circuit 25. In one embodiment, the signals in the middle voltage domain may be switched between the second high level voltage VDD2 and the first low level voltage GND1. In one embodiment, the first high level voltage VDD1 may be 2.8 volt (V), and the second high level voltage may be 3.3V. In one embodiment, the middle voltage domain circuit 23 converts the signals at the first high level voltage VDD1 of the first voltage domain into the signals at the second high level voltage VDD2 of the second voltage domain.

The middle voltage domain circuit 23 includes a first input transistor MN1, a second input transistor MN3, a first output transistor MP1, a second output transistor MP3, a first control transistor MP2, and a second control transistor MP4. The first input transistor MN1 and the second input transistor MN3 form an input unit 231, and the first control transistor MP2 and the second control transistor MP4 form a control unit 232. A gate electrode of the first input transistor MN1 is electrically connected with the output terminal of the second invertor INT2, and a gate electrode of the second input transistor MN3 is electrically connected with the output terminal of the first invertor INT1. A source electrode of the first input transistor MN1 and a source electrode of the second input transistor MN3 receive the first low level voltage GND1. A drain electrode of the first input transistor MN1 is electrically connected with a drain electrode of the first output transistor MP1 through a first control transistor MP2 and a first node N1. A drain of the second input transistor MN3 is electrically connected with a drain electrode of the second output transistor MP3 through the second control transistor MP4 and a second node N2. A gate electrode of the first output transistor MP1 is electrically connected with the second voltage domain circuit 25 through the second node N2, and a gate electrode of the second output transistor MP3 is electrically connected with the second voltage domain circuit 25 through the first node N1. Source electrodes of the first output transistor MP1 and the second transistor MP3 receives the second low level voltage GND2. Gate electrodes of the first control transistor MP2 and the second control transistor MP4 receive the second low level voltage GND2. A source electrode of the first control transistor MP2 is electrically connected with the first node N1, and a drain electrode of the first control transistor MP2 is electrically connected with the drain electrode of the first input transistor MN1. A source electrode of the second control transistor MP2 is electrically connected with the second node N2, and a drain electrode of the second control transistor MP4 is electrically connected with the drain electrode of the second input transistor MN3. In one embodiment, the first input transistor MN1 and second input transistor MN3 are NMOS transistors, and the first output transistor MP1 and the second output transistor MP3 are PMOS transistors.

The second voltage domain circuit 25 is electrically connected with the middle voltage domain circuit 23. The second voltage domain circuit 25 converts the signals in the middle voltage domain into signals in the second voltage domain. In one embodiment, the signals in the second voltage domain may be switched between the second high level voltage VDD2 and the second low level voltage GND2. Both of the first high level voltage VDD1 and the second high level voltage VDD2 are larger than the first low level voltage GND1 and the second low level voltage GND2. In one embodiment, the first low level voltage GND1 is less than the second low level voltage GND2. The first low level voltage GND1 can be −8V, and the second low level voltage GND2 can be −6V.

The second voltage domain circuit 25 includes a first transistor MN6, a second transistor MN8, a third transistor MN5, a fourth transistor MN7, a fifth transistor MP5, a sixth transistor MP6, a third invertor INT3, a fourth inventor INT4, a fifth inventor INT5, a sixth inventor INT6, a first output terminal VOUTP, and a second output terminal VOUTN. The first transistor MN6, the second transistor MN8, the fifth transistor MP5, and the sixth transistor MP6 form a latch. A gate electrode of the first transistor MN6 is electrically connected with the first node N1, a drain electrode of the first transistor MN6 is electrically connected with a drain electrode of the fifth transistor MP5 through a third node N3, and a source electrode of the first transistor MN6 is electrically connected with a drain electrode of the third transistor MN5. A gate electrode of the second transistor MN8 is electrically connected with the second node N2, a drain electrode of the second transistor MN8 is electrically connected with a drain electrode of the sixth transistor MP6 through a fourth node N4, and a source electrode of the second transistor MN8 is electrically connected with a drain electrode of the fourth transistor MN7. Substrates of the first transistor MN6 and the second transistor MN8 receive the second low level voltage GND2. A gate electrode of the third transistor MN5 is electrically connected with the fourth node N4, and a source electrode of the third transistor MN5 receives the second low level voltage GND2. A gate electrode of the fourth transistor MN7 is electrically connected with the third node N3, and a source of the fourth transistor MN7 receives the second low level voltage GND2. A gate electrode of the fifth transistor MP5 is electrically connected with the first node N1, a source electrode of the fifth transistor MP5 receives the second high level voltage VDD2, and a drain electrode of the fifth transistor MP5 is electrically connected with the third node N3. A gate electrode of the sixth transistor MP6 is electrically connected with the second node N2, a source electrode of the sixth transistor MP6 receives the second high level voltage VDD2, and a drain electrode of the sixth transistor MP6 is electrically connected with fourth node N4. The third invertor INT3 and the fourth invertor INT4 are electrically connected between the third node N3 and the first output terminal VOUTP in series. An input terminal of the third invertor INT3 is electrically connected with the third node N3, and an output terminal of the third invertor INT3 is electrically connected with an input terminal of the fourth invertor INT4. An output terminal of the fourth invertor INT4 is electrically connected with the first output terminal VOUTP. The fifth invertor INT5 and the sixth invertor INT6 are electrically connected between the fourth node N4 and the second output terminal VOUTN in series. An input terminal of the fifth invertor INT5 is electrically connected with the fourth node N4, and an output terminal of the fifth invertor INT5 is electrically connected with an input terminal of the sixth invertor INT6. An output terminal of the sixth invertor INT6 is electrically connected with the second output terminal VOUTN. In one embodiment, the first transistor MN6, the second transistor MN8, the third transistor MN5, and the fourth transistor MN7 are NMOS transistors. The fifth transistor MP5 and the sixth transistor MP6 are POMS transistors.

An operation of the first level shift circuit 200A is as follows.

When the input terminal VIN receives the first low level voltage GND1 in the first voltage domain, the gate electrode of the first input transistor MN1 receives the first low level voltage GND1 in the first voltage domain, and the first input transistor MN1 turns off. The gate electrode of the second input transistor MN3 receives the first high level voltage VDD1 in the first voltage domain, and the second input transistor MN3 turns on. The voltage of the drain electrode of the second input transistor MN3 is equal to the first low level voltage GND1. Based on the first low level voltage GND1 less than the second low level voltage GND2, the second control transistor MP4 turns off, thus the voltage of the second node N2 is larger than or equal to a sum of the second low level voltage GND2 and a threshold voltage VTHP of the second control transistor MP4, which cause the first output transistor MP1 to turn on. The voltage of the first node N1 is equal to the second high level voltage VDD2. Due to the second low level voltage GND2 is less than the second high level voltage VDD2, the first control transistor MP2 turns on. The voltage of the drain electrode of the first input transistor MN1 is equal to the second high level voltage VDD2. Due to the voltage of the first node N1, the second output transistor MP3 turns off. The voltage of the second node N2 is equal to a sum of the second low level voltage GND2 and a threshold voltage VTHP of the second control transistor MP4. The voltage of the first node N1 is equal to the second high level voltage VDD2, the first transistor MN5 turns on, and the fifth transistor MP5 turns off, which cause the voltage of the third node N3 to be equal to the second low level voltage GND2. By the inverting function of the third invertor INT3 and the fourth invertor INT4, the voltage of the first output terminal VOUTP is equal to the second low level voltage GND2. Further, due to the voltage of the second node N2, the second transistor MN8 turns off, and the sixth transistor MP6 turns on, which cause the voltage of the fourth node N4 to be equal to the second high level voltage VDD2. By the inverting function of the fifth invertor INT5 and the sixth invertor INT6, the voltage of the second output terminal VOUTN is equal to the second high level voltage VDD2.

When the voltage of the input terminal VIN is switched to the first high level voltage VDD1 in the first voltage domain, the gate electrode of the first input transistor MN1 receives the first high level voltage VDD1 in the first voltage domain, and the first input transistor MN1 turns on. The voltage of the first node N1 is decreased from the second high level voltage VDD2, which causes the first control transistor MP2 to be turned off. The second output transistor MP3 turns on, and the voltage of the second node N2 is increased from the second low level voltage GND2, which causes the first output transistor MP1 to be turns off. When the first control transistor MP2 turns off, the voltage of the first node N1 is larger than the sum of the second low level voltage GND2 and a threshold voltage VTHP of the first control transistor MP2. When the first output transistor MP1 turns on, the voltage of the second node N2 is equal to the second high level voltage VDD2. Due to the voltage of the first node N1, the first transistor MN6 turns off, and the fifth transistor MP5 turns on, which cause the voltage of the third node N3 to be equal to the second high level voltage VDD2. By the inverting function of the third invertor INT3 and the fourth invertor INT4, the voltage of the first output terminal VOUTP is equal to the second high level voltage VDD2. Further, due to the voltage of the second node N2, the second transistor MN8 turns on, and the sixth transistor MP6 turns off, which cause the voltage of the fourth node N4 to be equal to the second low level voltage GND2. By the inverting function of the fifth invertor INT5 and the sixth invertor INT6, the voltage of the second output terminal VOUTN is equal to the second low level voltage GND2.

Based on the structure of the first level shift circuit 200A, the second voltage domain circuit 25 converts the signals in the first voltage domain into the signals in the second voltage domain, and the low level voltage is switched. By the second voltage domain circuit 25, the voltage change of each transistor in the first level shift circuit 200A is less than a corresponding withstand threshold voltage, and the transistors in the first level circuit 200A is protected from being broken down while converting in different voltage domains.

Second Embodiment

Figure 3:
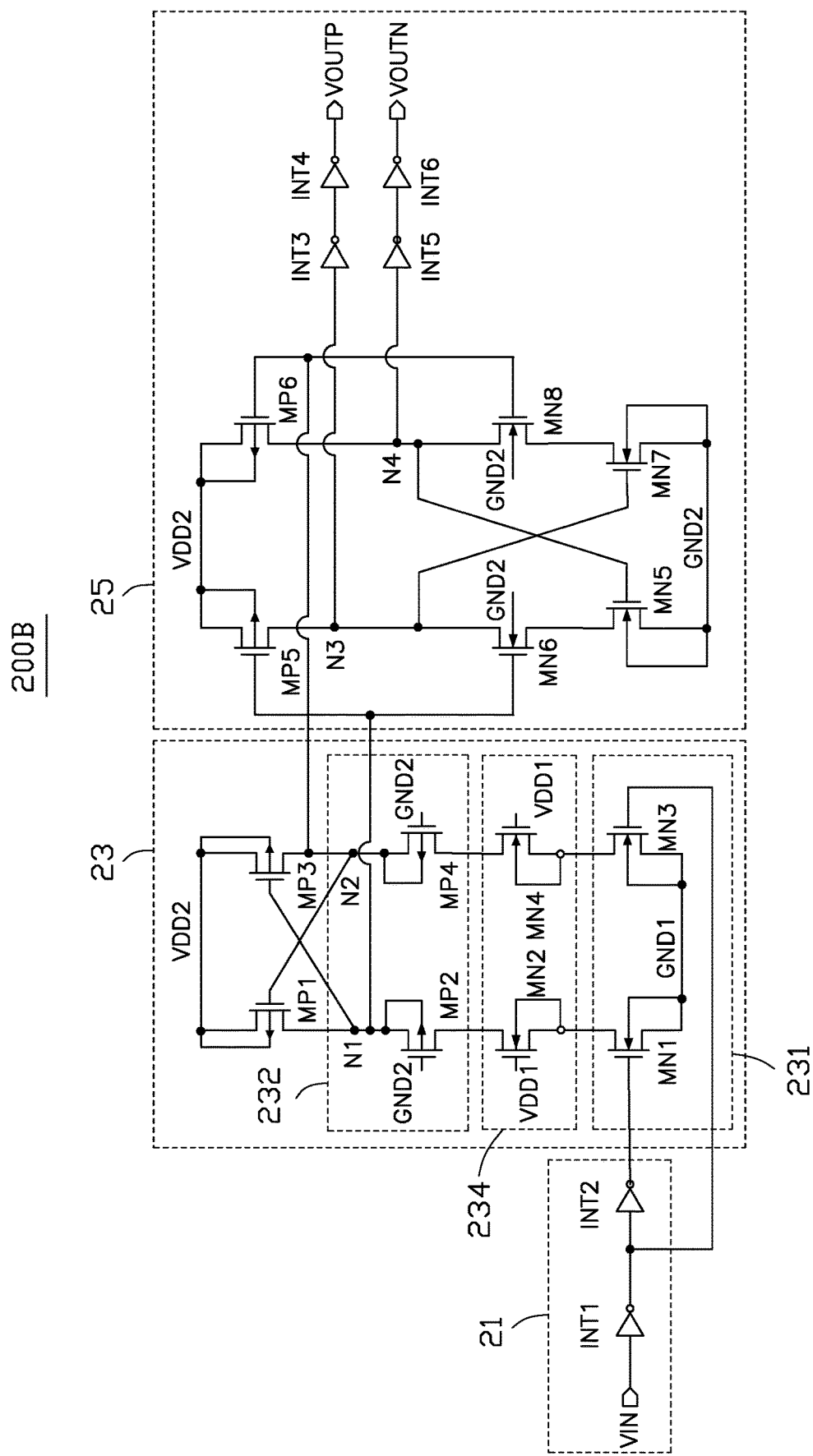
FIG. 3 is a circuit diagram illustrating a second embodiment of the level shift circuit of FIG. 1.

FIG. 3 shows a circuit diagram of a second embodiment of the second level shift circuit 200B. The structure of the second level shift circuit 200B is similar to the structure of the first level shift circuit 200A, the difference is that the second level shift circuit 200B further includes a shielding unit 234. The shielding unit 234 is electrically connected between the input unit 231 and the control unit 232.

The shielding unit 234 includes a first shielding transistor MN2 and a second shielding transistor MN4. A gate electrode of the first shielding transistor MN2 receives the first high level voltage VDD1, a source electrode of the first shielding transistor MN2 is electrically connected with the drain electrode of the first input transistor MN1, and a drain electrode of the first shielding transistor MN2 is electrically connected with the drain electrode of the first control transistor MP2. A gate electrode of the second shielding transistor MN4 receives the first high level voltage VDD1, a source electrode of the second shielding transistor MN4 is electrically connected with the drain electrode of the second input transistor MN3, and a drain electrode of the second shielding transistor MN4 is electrically connected with the drain electrode of the second control transistor MP4. In one embodiment, the first shielding transistor MN2 and the second shielding transistor MN4 are NMOS transistors.

An operation of the second level shift circuit 200B is similar to the operation of the first level shift circuit 200A. The operation of the shielding unit 234 as a difference between the second level shift circuit 200B and the first level shift circuit 200A is as follows.

When the input terminal INT receives the first low level voltage GND1, the voltage of the drain electrode of the first control transistor MP2 is equal to the second high level voltage VDD2, the first shielding transistor MN2 turns off, which cause the voltage of the source electrode of the first shielding transistor MN2 to be larger than the sum of the first high level voltage VDD1 and the threshold voltage VTHN of the first shielding transistor MN2. A withstand threshold voltage of the first shielding transistor MN2 is calculated by the follow formula.

$$Vsg = VDD2 - VDD1 + VTHN \quad 1)$$

Vsg represents the withstand threshold voltage of the first shielding transistor MN2.

By adjusting a difference between the first high level voltage VDD1 and the second high level voltage VDD2, the first shielding transistor MN2 can be protected from being broken down.

Due to the first shielding transistor MN2, the maximum voltage of the drain electrode of the first input transistor MN1 is equal to a difference between the first high level voltage VDD1 and the threshold voltage VTHN of the first shielding transistor MN2. In the first embodiment, the maximum voltage of the drain electrode of the first input transistor MN1 is equal to the second high level voltage VDD2, thus the voltage of the drain electrode of the first input transistor MN1 is decreased for protecting the first input transistor MN1 from being broken down. Meanwhile, due to the second shielding transistor MN4, the maximum voltage of the drain electrode of the second input transistor MN3 is equal to a difference between the first high level voltage VDD1 and the threshold voltage VTHN of the second shielding transistor MN4. In the first embodiment, the maximum voltage of the drain electrode of the second input transistor MN3 is equal to the second high level voltage VDD2, thus the voltage of the drain electrode of the second input transistor MN3 is decreased for protecting the second input transistor MN3 from being broken down.

Based on the structure of the second level shift circuit 200B, the second voltage domain circuit 25 converts the signals in the first voltage domain into the signals in the second voltage domain, and the low level voltage is switched. By the second voltage domain circuit 25, the voltage change of each transistor in the first level shift circuit 200A is less than a corresponding withstand threshold voltage, and the transistors in the first level circuit 200A is protected from being broken down while converting in different voltage domains. Further, due to the first shielding transistor MN2 and the second shielding transistor MN4, the first input transistor MN1 and the second transistor MN3 are protected from being broken down.

Third Embodiment

Figure 4:
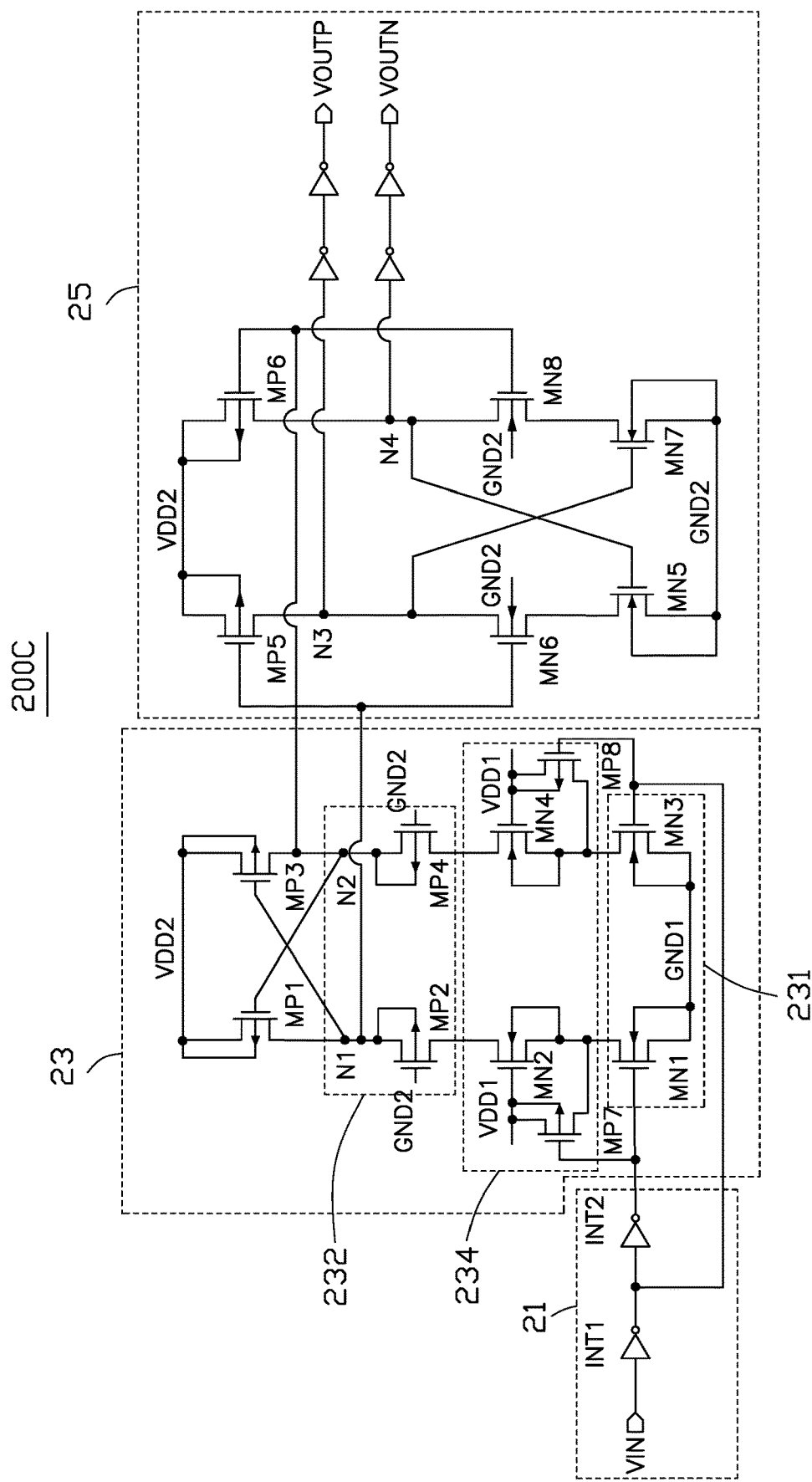
FIG. 4 is a circuit diagram illustrating a third embodiment of the level shift circuit of FIG. 1.

FIG. 4 is a circuit diagram of a third embodiment of the third level shift circuit 200C. The structure of the third level shift circuit 200C is similar to the structure of the second level shift circuit 200B, the difference is the structure of the shielding unit 234. The shielding unit 234 further includes a third shielding transistor MP7 and a fourth shielding transistor MP8.

A gate electrode of the third shielding transistor MP7 is electrically connected with the gate electrode of the first input transistor MN1, a source electrode of the third shielding transistor MP7 receives the first high level voltage VDD1, and a drain electrode of the third shielding transistor MP7 is electrically connected between the source electrode of the first shielding transistor MN2 and the drain electrode of the first input transistor MN1. A gate electrode of the fourth shielding transistor MP8 is electrically connected with the gate electrode of the second input transistor MN3, a source electrode of the fourth shielding transistor MP8 receives the first high level voltage VDD1, and a drain electrode of the fourth shielding transistor MP8 is electrically connected between the source electrode of the second shielding transistor MN4 and the drain electrode of the second input transistor MN3. In one embodiment, the third shielding transistor MP7 and the fourth shielding transistor MP8 are PMOS transistors.

An operation of the third level shift circuit 200C is similar to the operation of the second level shift circuit 200B. The operation of the shielding unit 234 as a difference between the third level shift circuit 200C and the second level shift circuit 200B is as follows.

When the signal of the input terminal INT is switched from the first high level voltage VDD1 to the first low level voltage GND1, the third shielding transistor MP7 turns on, which cause the voltage of the drain electrode of the first input transistor MN1 to be equal to the first high level voltage VDD1 rapidly. When the signal of the input terminal INT is switched from the first low level voltage GND1 to the first high level voltage VDD1, the fourth shielding transistor MP8 turns on, which cause the voltage of the drain electrode of the second input transistor MN3 to be equal to the first high level voltage VDD1 rapidly.

In one embodiment, due to the different high level voltages and the different low level voltage in the first voltage domain and the second voltage domain, the transistors in the second voltage domain circuit 25 is manufactured by a Deep N-well process, for insulating the first high level voltage VDD1 and the second high level voltage VDD2 and insulating the first low level voltage GND1 and the second low level voltage GND2. A noise generated by the third level shift circuit 200C while converting the signals is reduced. Each of the first shielding transistor MN2, the second shielding transistor MN4, the first output transistor MP1, and the second output transistor MP3 are disposed in an independent Deep N-well for insulating the source electrodes of the first shielding transistor MN2 and the second shielding transistor MN4 from the substrate, a bias effect is avoided and the threshold voltage of the transistor is decreased. Therefore, a flipping speed of the third level shift circuit 200C is improved.

Fourth Embodiment

Figure 5:
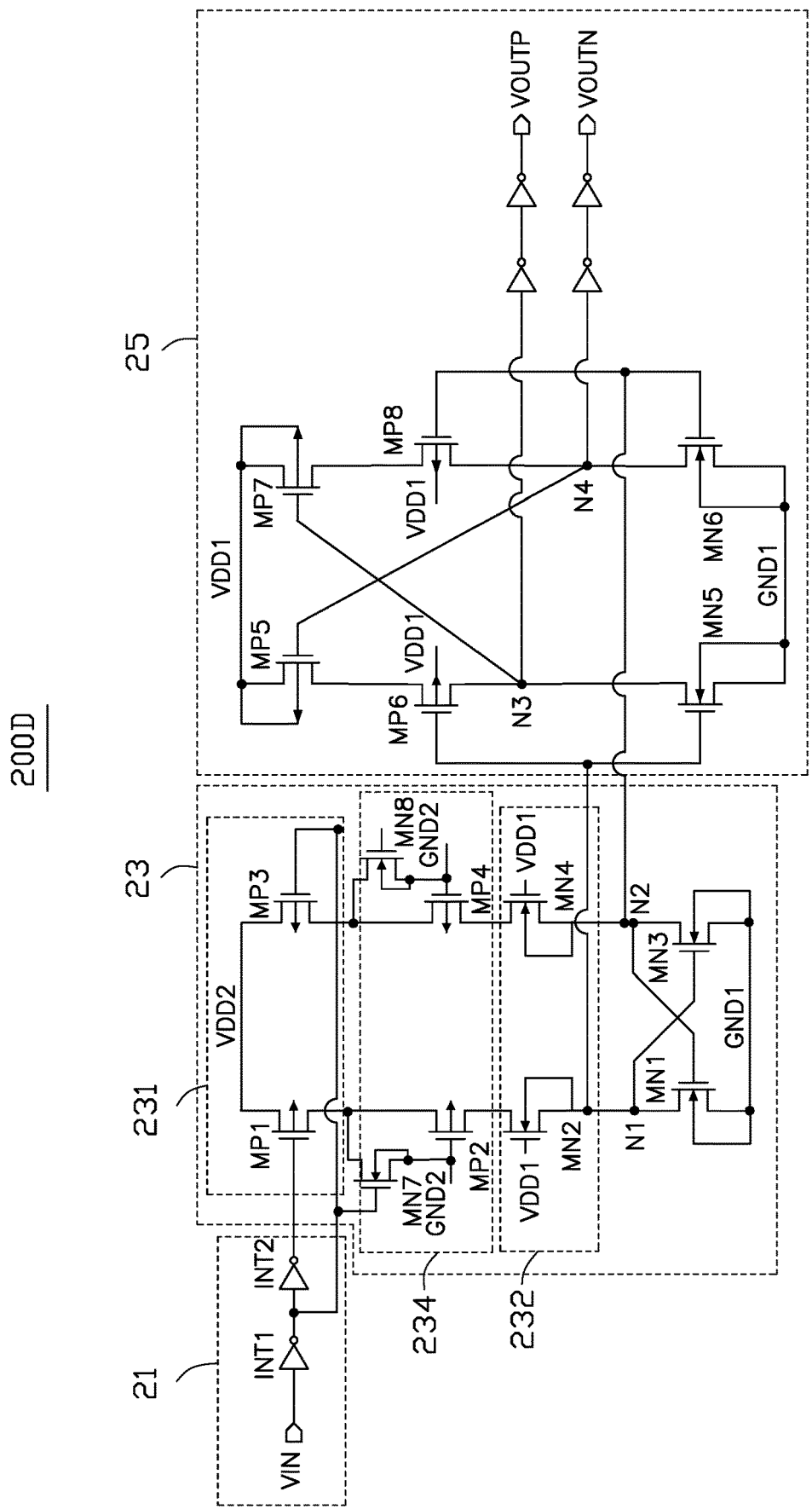
FIG. 5 is a circuit diagram illustrating a fifth embodiment of the level shift circuit of FIG. 1.

FIG. 5 is a circuit diagram of a third embodiment of the fourth level shift circuit 200D. The structure of the fourth level shift circuit 200D is similar to the structure of the third level shift circuit 200C, the difference is the structure of the middle voltage domain circuit 23 and the second voltage domain circuit 25. In one embodiment, the fourth level shift circuit 200D converts the signals in the high voltage domain into the signals in the low voltage domain. In the first voltage domain, the signals are switched between the second high level voltage VDD2 and the second low level voltage GND2. In the second voltage domain, the signals are switched between the first high level voltage VDD1 and the first low level voltage GND1. The middle voltage domain circuit 23 converts the signals at the second low level voltage GND2 of the first voltage domain into the signals at the first low level voltage GND1 of the second voltage domain. In the fourth embodiment, types of all of the transistors in the middle voltage domain are changed. In that means, the first input transistor MP1, the second input transistor MP3, the first shielding transistor MP2, the second shielding transistor MP4 are PMOS transistors. The first output transistor MN1, the second output transistor MN3, the first control transistor MN2, the second control transistor MN4, the third shielding transistor MN7, and the fourth shielding transistor MN8 are NMOS transistors. The source electrodes of the first input transistor MP1 and the second input transistor MP3 receive the second high level voltage VDD2, and the source electrodes of the first output transistor MN1 and the second output transistor MN3 receive the first low level voltage GND1. The gate electrodes of the first control transistor MN2 and the second control transistor MN4 receive the first high level voltage VDD1. The gate electrodes of the first shielding transistor MP2 and the second shielding transistor MP4 receive the second low level voltage GND2.

In the second voltage domain circuit 25, the types of all the transistors are changed. The first transistor MP6, the second transistor MP8, the third transistor MP5, and the fourth transistor MP7 are PMOS transistors. The fifth transistor MN5 and the sixth transistor MN6 are NMOS transistors. The substrates of the first transistor MP6 and the second transistor MP8 receive the first high level voltage VDD1. The source electrodes of the third transistor MP5, and the fourth transistor MP7 receive the first high level voltage VDD1. The source electrode of the fifth transistor MN5 and the sixth transistor MN6 receive the first low level voltage GND1.

Based on the structure of the fourth level shift circuit 200D, the second voltage domain circuit 25 converts the signals in the high voltage domain into the signals in the low voltage domain, and the low level voltage is switched. By the second voltage domain circuit 25, the voltage change of each transistor in the first level shift circuit 200A is less than a corresponding withstand threshold voltage, and the transistors in the first level circuit 200A is protected from being broken down while converting in different voltage domains. Further, due to the first shielding transistor MN2 and the second shielding transistor MN4, the first input transistor MN1 and the second transistor MN3 are protected from being broken down. Due to the third shielding transistor MP7 MN7 and the fourth shielding transistor MN8, a response time of the first input transistor MP1 and the second input transistor MP3 is increased, thus a flipping speed of the fourth level shift circuit 200D is improved.

In other embodiments, the first level shift circuit 200A and the second level shift circuit 200B may convert the signals in the high voltage domain into the signals in the low voltage domain. In the first voltage domain, the signals are switched between the second high level voltage VDD2 and the second low level voltage GND2. In the second voltage domain, the signals are switched between the first high level voltage VDD1 and the first low level voltage GND1. For example, by using the structure of the first level shift circuit 200A as shown in FIG. 2, the first input transistor MN1 and the second input transistor MN3 are changed to PMOS transistors. The first output transistor MP1, the second output transistor MP3, the first control transistor MP2, and the second control transistor MP4 are changed to NMOS transistors. The source electrodes of the first input transistor MN1 and the second input transistor MN3 receive the second high level voltage VDD2. The source electrodes of the first output transistor MP1 and the second output transistor MP3 receive the first low level voltage GND1. The gate electrodes of the first control transistor MP2 and the second control transistor MP4 receive the first high level voltage VDD1.

For example, by using the structure of the second level shift circuit 200B as shown in FIG. 3, the first input transistor MN1, the second input transistor MN3, the first shielding transistor MN2, and the second shielding transistor MN4 are changed to PMOS transistors. The first output transistor MP1, the second output transistor MP3, the first control transistor MP2, and the second control transistor MP4 are changed to NMOS transistors. The source electrodes of the first input transistor MN1 and the second input transistor MN3 receive the second high level voltage VDD2. The source electrodes of the first output transistor MP1 and the second output transistor MP3 receive the first low level voltage GND1. The gate electrodes of the first control transistor MP2 and the second control transistor MP4 receive the first high level voltage VDD1. The gate electrodes of the first shielding transistor MN2 and the second shielding transistor MN4 receive the second low level voltage GND2.

Persons of ordinary skill in the art should realize that the above implementation modes are merely used to describe some embodiments, but are not intended to limit the present disclosure, and any proper changes and variations made to the above embodiments within the spirit and scope of the present disclosure shall fall within the scope of the present disclosure.

What is claimed is:

1. A level shift circuit configured for converting signals from a first voltage domain into signals in a second voltage domain; the level shift circuit comprising:
a first voltage domain circuit, configured to receive signals in the first voltage domain; the received signals in the first voltage domain are switched between a first high level voltage and a first low level voltage;
a middle voltage domain circuit, configured to convert the signals in the first voltage domain into signals in a middle voltage domain; the signals in the middle voltage domain are switched between a second high level voltage and the first low level voltage, wherein the first high level voltage is different from the second high level voltage; and
a second voltage domain circuit, configured to convert the signals in the middle voltage domain into signals in the second voltage domain; the signals in the second voltage domain are switched between the second high level voltage and a second low level voltage, wherein the first high level voltage and the second high level voltage are larger than the first low level voltage and the second low level voltage respectively, and the second low level voltage is difference from the first low level voltage;
wherein the middle voltage domain circuit comprises a first input transistor, a second input transistor, a first output transistor, a second output transistor, a first control transistor, and a second control transistor, wherein a gate electrode of the first input transistor and a gate electrode of the second input transistor are electrically connected with the first voltage domain circuit; a source electrode of the first input transistor and a source electrode of the second input transistor receive the first low level voltage; a drain electrode of the first input transistor is electrically connected with a drain electrode of the first output transistor through a first control transistor and a first node; a drain of the second input transistor is electrically connected with a drain electrode of the second output transistor through the second control transistor and a second node; a gate electrode of the first output transistor is electrically connected with the second voltage domain circuit through the second node, and a gate electrode of the second output transistor is electrically connected with the second voltage domain circuit through the first node; source electrodes of the first output transistor and the second output transistor receives the second low level voltage; gate electrodes of the first control transistor and the second control transistor receive the second low level voltage; a source electrode of the first control transistor is electrically connected with the first node, and a drain electrode of the first control transistor is electrically connected with the drain electrode of the first input transistor; a source electrode of the second control transistor is electrically connected with the second node, and a drain electrode of the second control transistor is electrically connected with the drain electrode of the second input transistor.

2. The level shift circuit of claim 1, wherein the first high level voltage is less than the second high level voltage; the first low level voltage is less than the second low level voltage; the middle voltage domain circuit is further configured to convert signals at the first high level voltage of the first voltage domain into signals at the second high level voltage of the second voltage domain.

3. The level shift circuit of claim 2, wherein the first voltage domain circuit is further configured to output a first output signal and a second output signal, wherein phases of the first output signal and the second output signal are opposite; wherein a gate electrode of the first input transistor receives the first output signal, and a gate electrode of the second input transistor receives the second output signal.

4. The level shift circuit of claim 3, wherein the level shift circuit further comprises a shielding unit; the shielding unit comprises a first shielding transistor and a second shielding transistor; a gate electrode of the first shielding transistor receives the first high level voltage, a source electrode of the first shielding transistor is electrically connected with the drain electrode of the first input transistor, and a drain electrode of the first shielding transistor is electrically connected with the drain electrode of the first control transistor; a gate electrode of the second shielding transistor receives the first high level voltage, a source electrode of the second shielding transistor is electrically connected with the drain electrode of the second input transistor, and a drain electrode of the second shielding transistor is electrically connected with the drain electrode of the second control transistor.

5. The level shift circuit of claim 4, wherein the shielding unit further comprises a third shielding transistor and a fourth shielding transistor; a gate electrode of the third shielding transistor is electrically connected with the gate electrode of the first input transistor, a source electrode of the third shielding transistor receives the first high level voltage, and a drain electrode of the third shielding transistor is electrically connected between the source electrode of the first shielding transistor and the drain electrode of the first input transistor; a gate electrode of the fourth shielding transistor is electrically connected with the gate electrode of the second input transistor, a source electrode of the fourth shielding transistor receives the first high level voltage, and a drain electrode of the fourth shielding transistor is electrically connected between the source electrode of the second shielding transistor and the drain electrode of the second input transistor.

6. The level shift circuit of claim 3, wherein the second voltage domain circuit comprises a first transistor, a second transistor, a third transistor, a fourth transistor, a fifth transistor, a sixth transistor, a third invertor, a fourth inventor, a fifth inventor, a sixth inventor, a first output terminal, and a second output terminal, wherein a gate electrode of the first transistor is electrically connected with the first node, a drain electrode of the first transistor is electrically connected with a drain electrode of the fifth transistor through a third node, and a source electrode of the first transistor is electrically connected with a drain electrode of the third transistor; a gate electrode of the second transistor is electrically connected with the second node, a drain electrode of the second transistor is electrically connected with a drain electrode of the sixth transistor through a fourth node, and a source electrode of the second transistor is electrically connected with a drain electrode of the fourth transistor; substrates of the first transistor and the second transistor receive the second low level voltage; a gate electrode of the third transistor is electrically connected with the fourth node, and a source electrode of the third transistor receives the second low level voltage; a gate electrode of the fourth transistor is electrically connected with the third node, and a source of the fourth transistor receives the second low level voltage; a gate electrode of the fifth transistor is electrically connected with the first node, a source electrode of the fifth transistor receives the second high level voltage, and a drain electrode of the fifth transistor is electrically connected with the third node; a gate electrode of the sixth transistor is electrically connected with the second node, a source electrode of the sixth transistor receives the second high level voltage, and a drain electrode of the sixth transistor is electrically connected with fourth node; an input terminal of the third invertor is electrically connected with the third node, and an output terminal of the third invertor is electrically connected with an input terminal of the fourth invertor; an output terminal of the fourth invertor is electrically connected with the first output terminal; an input terminal of the fifth invertor is electrically connected with the fourth node, and an output terminal of the fifth invertor is electrically connected with an input terminal of the sixth invertor; an output terminal of the sixth invertor is electrically connected with the second output terminal.

7. A display apparatus comprises a data driving circuit disposed in a non-display region; the data driving circuit provides image signals to data lines in a display region surrounded by the non-display region; the data driving circuit comprises a level shift circuit configured for converting input signals in a first voltage domain into output signals in a second voltage domain; the level shift circuit comprising:
a first voltage domain circuit, configured to receive signals in the first voltage domain; the received signals in the first voltage domain are switched between a first high level voltage and a first low level voltage;
a middle voltage domain circuit, configured to convert the signals in the first voltage domain into signals in a middle voltage domain; the signals in the middle voltage domain are switched between a second high level voltage and the first low level voltage, wherein the first high level voltage is different from the second high level voltage; and
a second voltage domain circuit, configured to convert the signals in the middle voltage domain into signals in the second voltage domain; the signals in the second voltage domain are switched between the second high level voltage and a second low level voltage, wherein the first high level voltage and the second high level voltage are larger than the first low level voltage and the second low level voltage respectively; and the second low level voltage is difference from the first low level voltage;
wherein the middle voltage domain circuit comprises a first input transistor, a second input transistor, a first output transistor, a second output transistor, a first control transistor, and a second control transistor, wherein a gate electrode of the first input transistor and a gate electrode of the second input transistor are electrically connected with the first voltage domain circuit; a source electrode of the first input transistor and a source electrode of the second input transistor receive the first low level voltage; a drain electrode of the first input transistor is electrically connected with a drain electrode of the first output transistor through a first control transistor and a first node; a drain of the second input transistor is electrically connected with a drain electrode of the second output transistor through the second control transistor and a second node; a gate electrode of the first output transistor is electrically connected with the second voltage domain circuit through the second node, and a gate electrode of the second output transistor is electrically connected with the second voltage domain circuit through the first node; source electrodes of the first output transistor and the second output transistor receives the second low level voltage; gate electrodes of the first control transistor and the second control transistor receive the second low level voltage; a source electrode of the first control transistor is electrically connected with the first node, and a drain electrode of the first control transistor is electrically connected with the drain electrode of the first input transistor; a source electrode of the second control transistor is electrically connected with the second node, and a drain electrode of the second control transistor is electrically connected with the drain electrode of the second input transistor.

8. The display apparatus of claim 7, wherein the first high level voltage is less than the second high level voltage; the first low level voltage is less than the second low level voltage; the middle voltage domain circuit is further configured to convert the signals at the first high level voltage of the first voltage domain into signals at the second high level voltage of the second voltage domain.

9. The display apparatus of claim 8, wherein the first voltage domain circuit is further configured to output a first output signal and a second output signal, wherein phases of the first output signal and the second output signal are opposite; wherein a gate electrode of the first input transistor receives the first output signal, and a gate electrode of the second input transistor receives the second output signal.

10. The display apparatus of claim 9, wherein the level shift circuit further comprises a shielding unit; the shielding unit comprises a first shielding transistor and a second shielding transistor; a gate electrode of the first shielding transistor receives the first high level voltage, a source electrode of the first shielding transistor is electrically connected with the drain electrode of the first input transistor, and a drain electrode of the first shielding transistor is electrically connected with the drain electrode of the first control transistor; a gate electrode of the second shielding transistor receives the first high level voltage, a source electrode of the second shielding transistor is electrically connected with the drain electrode of the second input transistor, and a drain electrode of the second shielding transistor is electrically connected with the drain electrode of the second control transistor.

11. The display apparatus of claim 10, wherein the shielding unit further comprises a third shielding transistor and a fourth shielding transistor; a gate electrode of the third shielding transistor is electrically connected with the gate electrode of the first input transistor, a source electrode of the third shielding transistor receives the first high level voltage, and a drain electrode of the third shielding transistor is electrically connected between the source electrode of the first shielding transistor and the drain electrode of the first input transistor; a gate electrode of the fourth shielding transistor is electrically connected with the gate electrode of the second input transistor, a source electrode of the fourth shielding transistor receives the first high level voltage, and a drain electrode of the fourth shielding transistor is electrically connected between the source electrode of the second shielding transistor and the drain electrode of the second input transistor.

12. The display apparatus of claim 9, wherein the second voltage domain circuit comprises a first transistor, a second transistor, a third transistor, a fourth transistor, a fifth transistor, a sixth transistor, a third invertor, a fourth inventor, a fifth inventor, a sixth inventor, a first output terminal, and a second output terminal, wherein a gate electrode of the first transistor is electrically connected with the first node, a drain electrode of the first transistor is electrically connected with a drain electrode of the fifth transistor through a third node, and a source electrode of the first transistor is electrically connected with a drain electrode of the third transistor; a gate electrode of the second transistor is electrically connected with the second node, a drain electrode of the second transistor is electrically connected with a drain electrode of the sixth transistor through a fourth node, and a source electrode of the second transistor is electrically connected with a drain electrode of the fourth transistor; substrates of the first transistor and the second transistor receive the second low level voltage; a gate electrode of the third transistor is electrically connected with the fourth node, and a source electrode of the third transistor receives the second low level voltage; a gate electrode of the fourth transistor is electrically connected with the third node, and a source of the fourth transistor receives the second low level voltage; a gate electrode of the fifth transistor is electrically connected with the first node, a source electrode of the fifth transistor receives the second high level voltage, and a drain electrode of the fifth transistor is electrically connected with the third node; a gate electrode of the sixth transistor is electrically connected with the second node, a source electrode of the sixth transistor receives the second high level voltage, and a drain electrode of the sixth transistor is electrically connected with fourth node; an input terminal of the third invertor is electrically connected with the third node, and an output terminal of the third invertor is electrically connected with an input terminal of the fourth invertor; an output terminal of the fourth invertor is electrically connected with the first output terminal; an input terminal of the fifth invertor is electrically connected with the fourth node, and an output terminal of the fifth invertor is electrically connected with an input terminal of the sixth invertor; an output terminal of the sixth invertor is electrically connected with the second output terminal.

13. A level shift circuit configured for converting signals from a first voltage domain into signals in a second voltage domain; the level shift circuit comprising:
 a first voltage domain circuit, configured to receive signals in the first voltage domain; the received signals in the first voltage domain are switched between a first high level voltage and a first low level voltage;
 a middle voltage domain circuit, configured to convert the signals in the first voltage domain into signals in a middle voltage domain; the signals in the middle voltage domain are switched between the first high level voltage and a second low level voltage, wherein the first low level voltage is different from the second low level voltage; and
 a second voltage domain circuit, configured to convert the signals in the middle voltage domain into signals in the second voltage domain; the signals in the second voltage domain are switched between a second high level voltage and the second low level voltage, wherein the first high level voltage and the second high level voltage are larger than the first low level voltage and the second low level voltage respectively, and the second low level voltage is difference from the first low level voltage;
wherein the middle voltage domain circuit comprises a first input transistor, a second input transistor, a first output transistor, a second output transistor, a first control transistor, and a second control transistor; a gate electrode of the first input transistor and a gate electrode of the second input transistor are electrically connected with the first voltage domain circuit; source electrodes of the first input transistor and the second input transistor receive the first high level voltage; a drain electrode of the first input transistor is electrically connected with a drain electrode of the first output transistor through a first control transistor and a first node; a drain of the second input transistor is electrically connected with a drain electrode of the second output transistor through the second control transistor and a second node; a gate electrode of the first output transistor is electrically connected with the second voltage domain circuit through the second node, and a gate electrode of the second output transistor is electrically connected with the second voltage domain circuit through the first node; source electrodes of the first output transistor and the second output transistor receives the second low level voltage; gate electrodes of the first control transistor and the second control transistor receive the second high level voltage; a source electrode of the first control transistor is electrically connected with the first node, and a drain electrode of the first control transistor is electrically connected with the drain electrode of the first input transistor; a source electrode of the second control transistor is electrically connected with the second node, and a drain electrode of the second control transistor is electrically connected with the drain electrode of the second input transistor.

14. The level shift circuit of claim 13, wherein the first high level voltage is larger than the second high level voltage; the first low level voltage is larger than the second low level voltage; the middle voltage domain circuit is further configured to convert signals at the first low level voltage of the first voltage domain into signals at the second low level voltage of the second voltage domain, wherein the first voltage domain circuit is further configured to output a first output signal and a second output signal, wherein phases of the first output signal and the second output signal are opposite, wherein a gate electrode of the first input transistor receives the first output signal, and a gate electrode of the second input transistor receives the second output signal.

15. The level shift circuit of claim 14, wherein the level shift circuit further comprises a shielding unit; the shielding unit comprises a first shielding transistor, a second shielding transistor, a third shielding transistor, and a fourth shielding transistor; a gate electrode of the first shielding transistor receives the second low level voltage, a source electrode of the first shielding transistor is electrically connected with the drain electrode of the first input transistor, and a drain electrode of the first shielding transistor is electrically connected with the drain electrode of the first control transistor; a gate electrode of the second shielding transistor receives the second low level voltage, a source electrode of the second shielding transistor is electrically connected with the drain electrode of the second input transistor, and a drain electrode of the second shielding transistor is electrically connected with the drain electrode of the second control transistor; a gate electrode of the third shielding transistor is electrically connected with the gate electrode of the first input transistor, a source electrode of the third shielding transistor receives the first high level voltage, and a drain electrode of the third shielding transistor is electrically connected between the source electrode of the first shielding transistor and the drain electrode of the first input transistor; a gate electrode of the fourth shielding transistor is electrically connected with the gate electrode of the second input transistor, a source electrode of the fourth shielding transistor receives the first high level voltage, and a drain electrode of the fourth shielding transistor is electrically connected between the source electrode of the second shielding transistor and the drain electrode of the second input transistor.

16. The level shift circuit of claim 14, wherein the second voltage domain circuit comprises a first transistor, a second transistor, a third transistor, a fourth transistor, a fifth transistor, a sixth transistor, a third invertor, a fourth inventor, a fifth inventor, a sixth inventor, a first output terminal, and a second output terminal, wherein a gate electrode of the first transistor is electrically connected with the first node, a drain electrode of the first transistor is electrically connected with a drain electrode of the fifth transistor through a third node, and a source electrode of the first transistor is electrically connected with a drain electrode of the third transistor; a gate electrode of the second transistor is electrically connected with the second node, a drain electrode of the second transistor is electrically connected with a drain electrode of the sixth transistor through a fourth node, and a source electrode of the second transistor is electrically connected with a drain electrode of the fourth transistor; substrates of the first transistor and the second transistor receive the first high level voltage; a gate electrode of the third transistor is electrically connected with the fourth node, and a source electrode of the third transistor receives the first high level voltage; a gate electrode of the fourth transistor is electrically connected with the third node, and a source of the fourth transistor receives the first high level voltage; a gate electrode of the fifth transistor is electrically connected with the first node, a source electrode of the fifth transistor receives the first low level voltage, and a drain electrode of the fifth transistor is electrically connected with the third node; a gate electrode of the sixth transistor is electrically connected with the second node, a source electrode of the sixth transistor receives the first low level voltage, and a drain electrode of the sixth transistor is electrically connected with fourth node; an input terminal of the third invertor is electrically connected with the third node, and an output terminal of the third invertor is electrically connected with an input terminal of the fourth invertor; an output terminal of the fourth invertor is electrically connected with the first output terminal; an input terminal of the fifth invertor is electrically connected with the fourth node, and an output terminal of the fifth invertor is electrically connected with an input terminal of the sixth invertor; an output terminal of the sixth invertor is electrically connected with the second output terminal.

17. A display apparatus comprises a data driving circuit disposed in a non-display region; the data driving circuit provides image signals to the data lines in a display region surrounded by the non-display region; the data driving circuit comprises a level shift circuit configured for converting input signals in a first voltage domain into output signals in a second voltage domain; the level shift circuit comprising:
a first voltage domain circuit, configured to receive signals in the first voltage domain; the received signals in the first voltage domain are switched between a first high level voltage and a first low level voltage;

a middle voltage domain circuit, configured to convert the signals in the first voltage domain into signals in a middle voltage domain; the signals in the middle voltage domain are switched between the first high level voltage and a second low level voltage, wherein the first low level voltage is different from the second low level voltage; and a second voltage domain circuit, configured to convert the signals in the middle voltage domain into signals in the second voltage domain; the signals in the second voltage domain are switched between a second high level voltage and the second low level voltage, wherein the first high level voltage and the second high level voltage are larger than the first low level voltage and the second low level voltage respectively; and the second low level voltage is difference from the first low level voltage;

wherein the middle voltage domain circuit comprises a first input transistor, a second input transistor, a first output transistor, a second output transistor, a first control transistor, and a second control transistor; a gate electrode of the first input transistor and a gate electrode of the second input transistor are electrically connected with the first voltage domain circuit; source electrodes of the first input transistor and the second input transistor receive the first high level voltage; a drain electrode of the first input transistor is electrically connected with a drain electrode of the first output transistor through a first control transistor and a first node; a drain of the second input transistor is electrically connected with a drain electrode of the second output transistor through the second control transistor and a second node; a gate electrode of the first output transistor is electrically connected with the second voltage domain circuit through the second node, and a gate electrode of the second output transistor is electrically connected with the second voltage domain circuit through the first node; source electrodes of the first output transistor and the second output transistor receives the second low level voltage; gate electrodes of the first control transistor and the second control transistor receive the second high level voltage; a source electrode of the first control transistor is electrically connected with the first node, and a drain electrode of the first control transistor is electrically connected with the drain electrode of the first input transistor; a source electrode of the second control transistor is electrically connected with the second node, and a drain electrode of the second control transistor is electrically connected with the drain electrode of the second input transistor.

18. The display apparatus of claim 17, wherein the first high level voltage is larger than the second high level voltage; the first low level voltage is larger than the second low level voltage; the middle voltage domain circuit is further configured to convert signals at the first low level voltage of the first voltage domain into signals at the second low level voltage of the second voltage domain, wherein the first voltage domain circuit is further configured to output a first output signal and a second output signal, wherein phases of the first output signal and the second output signal are opposite, wherein a gate electrode of the first input transistor receives the first output signal, and a gate electrode of the second input transistor receives the second output signal.

19. The display apparatus of claim 18, wherein the level shift circuit further comprises a shielding unit; the shielding unit comprises a first shielding transistor, a second shielding transistor, a third shielding transistor, and a fourth shielding transistor; a gate electrode of the first shielding transistor receives the second low level voltage, a source electrode of the first shielding transistor is electrically connected with the drain electrode of the first input transistor, and a drain electrode of the first shielding transistor is electrically connected with the drain electrode of the first control transistor; a gate electrode of the second shielding transistor receives the second low level voltage, a source electrode of the second shielding transistor is electrically connected with the drain electrode of the second input transistor, and a drain electrode of the second shielding transistor is electrically connected with the drain electrode of the second control transistor; a gate electrode of the third shielding transistor is electrically connected with the gate electrode of the first input transistor, a source electrode of the third shielding transistor receives the first high level voltage, and a drain electrode of the third shielding transistor is electrically connected between the source electrode of the first shielding transistor and the drain electrode of the first input transistor; a gate electrode of the fourth shielding transistor is electrically connected with the gate electrode of the second input transistor, a source electrode of the fourth shielding transistor receives the first high level voltage, and a drain electrode of the fourth shielding transistor is electrically connected between the source electrode of the second shielding transistor and the drain electrode of the second input transistor.

20. The display apparatus of claim 18, wherein the second voltage domain circuit comprises a first transistor, a second transistor, a third transistor, a fourth transistor, a fifth transistor, a sixth transistor, a third invertor, a fourth inventor, a fifth inventor, a sixth inventor, a first output terminal, and a second output terminal, wherein a gate electrode of the first transistor is electrically connected with the first node, a drain electrode of the first transistor is electrically connected with a drain electrode of the fifth transistor through a third node, and a source electrode of the first transistor is electrically connected with a drain electrode of the third transistor; a gate electrode of the second transistor is electrically connected with the second node, a drain electrode of the second transistor is electrically connected with a drain electrode of the sixth transistor through a fourth node, and a source electrode of the second transistor is electrically connected with a drain electrode of the fourth transistor; substrates of the first transistor and the second transistor receive the first high level voltage; a gate electrode of the third transistor is electrically connected with the fourth node, and a source electrode of the third transistor receives the first high level voltage; a gate electrode of the fourth transistor is electrically connected with the third node, and a source of the fourth transistor receives the first high level voltage; a gate electrode of the fifth transistor is electrically connected with the first node, a source electrode of the fifth transistor receives the first low level voltage, and a drain electrode of the fifth transistor is electrically connected with the third node; a gate electrode of the sixth transistor is electrically connected with the second node, a source electrode of the sixth transistor receives the first low level voltage, and a drain electrode of the sixth transistor is electrically connected with fourth node; an input terminal of the third invertor is electrically connected with the third node, and an output terminal of the third invertor is electrically connected with an input terminal of the fourth invertor; an output terminal of the fourth invertor is electrically connected with the first output terminal; an input terminal of the fifth invertor is electrically connected with the fourth node, and an output terminal of the fifth invertor is electrically connected with an input terminal of the sixth invertor; an output terminal of the sixth invertor is electrically connected with the second output terminal.

* * * * *